United States Patent [19]
Mixon et al.

[11] Patent Number: 5,688,634
[45] Date of Patent: Nov. 18, 1997

[54] ENERGY SENSITIVE RESIST MATERIAL AND PROCESS FOR DEVICE FABRICATION USING THE RESIST MATERIAL

[75] Inventors: David Anton Mixon, Basking Ridge; Anthony Edward Novembre, Union, both of N.J.

[73] Assignee: Lucent Technologies Inc., Murray Hill, N.J.

[21] Appl. No.: 566,445

[22] Filed: Dec. 1, 1995

Related U.S. Application Data

[63] Continuation of Ser. No. 282,870, Jul. 29, 1994, abandoned.
[51] Int. Cl.$^6$ .................................................... G03F 7/30
[52] U.S. Cl. .................... 430/296; 430/311; 430/330; 430/942
[58] Field of Search .................... 430/296, 311, 430/330, 942, 270.1

[56] References Cited

U.S. PATENT DOCUMENTS

| | | | |
|---|---|---|---|
| 3,893,127 | 7/1975 | Kaplan et al. | 346/1 |
| 3,898,350 | 8/1975 | Gipstein et al. | 427/43 |
| 4,289,845 | 9/1981 | Bowden et al. | 430/296 |
| 4,398,001 | 8/1983 | Cheng et al. | 835/302 |
| 4,409,317 | 10/1983 | Shiraishi | 430/270 |

FOREIGN PATENT DOCUMENTS

| | | | |
|---|---|---|---|
| EP-A-0 419 073 | 3/1991 | European Pat. Off. | G03F 7/30 |
| EP-A-0 477 691 | 4/1992 | European Pat. Off. | G03F 7/039 |

OTHER PUBLICATIONS

Patent Abstracts of Japan, vol. 013, No. 272 (E–777), 22 Jun. 1989 and JP–A–01 061915 (Hitachi Ltd) (8 Mar. 1989).

"Modeling the Interupted Development of TNS Resist With Time–Dependent Dissolution Rate Equations", Anonymous, *IBM Technical Disclosure Bulletin*, vol. 33, No. 10A, New York, pp. 1–6, (Mar. 1991).

"Technique for Reversal Processing of Sulfone–Sensitized Resists," Anonymous, IBM Technical Disclosure Bulletin, vol. 26, No. 9, pp. 4680–4682, (Feb. 1994).

Patent Abstracts of Japan, vol. 017, No. 178 (E–1347), 7 Apr. 1993 & JP–A–04 333218 (Fujitsu Ltd) (20 Nov. 1992).

"Free Volume and Viscosity Effects in Polymer Layers: Application to Lithographic Processes", Paniez, P.J., Pons, M.J., Joubert, O.P., SPIE vol. 1262 Advances in Resist Technology and Processing VII (1990), pp. 483–492.

"Use of a Quartz Crystal Microbalane Rate Monitor to Examine Photoproduct Effects on Resist Dissolution", Hinsberg, W. D., Willson, C. G., Kanazawa, K. K., SPIE vol. 539 Advances in Resist Technology and Processing II (1965) pp. 6–13.

"Improved CD Uniformity as a Function of Developer Chemistry and Process Parameters Derived from a Statistically–Designed Experiment", Christensen, L. D. H., Bell, K. L., Acuna, N. A., SPIE vol. 1262 Advances in Resist Technology and Processing VII (1990) pp. 284–291.

"An In Situ Interferometric Analysis of Resist Devlopment on Photoma Substrates", Novembre, A.E., Tang, W.T., Hsieh, P., SPIE vol. 1087 Integrated Circuit Metrology, Inspection and Process Control III (1989) pp. 460–468.

"Effect of Developmer Type and Agitation of Dissolution of Positive Photoresist", Zee, C., Bell, W.R., Neureuther, A.R., SPIE vol. 920 Advances in Resist Technology and Processing V (1988) pp. 154–161.

"Polymer Compatibility and Incompatiblity", vol. II, (Karl Solc. ed. Harwood Academic, 1982).

"An In Situ Inferometric Analysis of Resist Development on Photomask Substrates" Novembre, 1989, SPIE vol. 1087, pp. 460–468.

Primary Examiner—Kathleen Duda
Attorney, Agent, or Firm—Richard J. Botos

[57] ABSTRACT

The present invention is directed to a process for device or mask fabrication. In the process, an energy sensitive resist material that is the combination of a matrix polymer and a modifier polymer is formed onto a substrate. The modifier polymer and matrix polymer are phase compatible. In this regard the modifier polymer has a weight average molecular weight of about 5,000 to about 500,000 g/mol, and at least some of the polymer chains are terminated by a halogen moiety. The resist material is patternwise exposed to radiation, thereby introducing a latent image of the pattern into the resist material. The energy depolymerizes the modifier polymer. The modifier polymer is substantially less soluble in a developer solution used to develop the pattern introduced into the resist than is the matrix polymer. Therefore, if the resist material is positive acting, the resist material that is exposed to radiation is substantially more soluble in developer solution than the unexposed resist material. The developer solution is used to selectively remove the exposed portion of the resist material, thereby developing the pattern introduced into the resist material by the patternwise exposure. The resist material is developed in an interruptive manner to reduce the amount of film loss in the portion of the resist material that is not exposed to radiation.

10 Claims, 1 Drawing Sheet

ENERGY SENSITIVE RESIST MATERIAL AND PROCESS FOR DEVICE FABRICATION USING THE RESIST MATERIAL

This application is a continuation of application Ser. No. 08/282870, filed on Jul. 29, 1994, now abandoned.

BACKGROUND OF THE INVENTION

1. Field of the Invention

The invention is directed to a lithographic process for device fabrication or mask fabrication in which a resist material that is a combination of a matrix polymer and an energy sensitive modifier polymer is used.

2. Art Background

Processes for device or mask fabrication frequently utilize lithographic processes in which a pattern is introduced into an energy sensitive resist material by patternwise exposing the resist to radiation and developing the image of the pattern introduced by the patternwise exposure. The pattern is then transferred into the underlying substrate. Energy sensitive resist materials that are a combination of a resist polymer such as a novolac resin and an energy sensitive modifier material such as a polymer that will cleave when the resist material is exposed to radiation are described in U.S. Pat. No. 4,289,845 to Bowden et al. and U.S. Pat. No. 4,398,001 to Cheng et al., the disclosures of which are hereby incorporated by reference. The modifier polymer is substantially insoluble in a developer solution relative to the novolac resin. When the modifier polymer is combined with the matrix polymer, the resulting blend is rendered substantially insoluble in the developer solution. When the modifier polymer is exposed to radiation, however, it cleaves, and that cleavage propagates a reaction that causes the fragmented modifier polymer to depolymerize. This renders the portion of the resist material that is exposed to radiation substantially more soluble in developer solution than the resist material that is not exposed to radiation.

In these processes, it is important for the pattern that is introduced into the resist to be transferred in the underlying substrate with an accuracy that is commensurate with the process requirements. As device features get smaller, e.g. 0.5 µm or less, the need for accuracy increases. One of the factors that affects the accuracy with which the pattern is transferred into the underlying substrates is the uniformity of the pattern. A uniform pattern is one in which the sidewalls of the pattern through the resist material thickness are substantially perpendicular relative to the plane of the substrate. Therefore, energy sensitive resist materials that achieve this advantageous result, and processes in which these materials are used, are desired.

SUMMARY OF THE INVENTION

The process of the present invention is directed to a process for fabrication of an article such as a mask or a device in which an energy-sensitive resist material overlying a substrate is exposed to radiation. The substrate is typically a silicon or a chrome on glass substrate. In processes for device fabrication, the substrates may have dielectric and metal regions formed thereon. The radiation introduces a difference in the ease of removal from the substrate of the exposed portions of the resist material relative to the unexposed portions of the resist material by a developing agent.

The resist material is a phase compatible blend of a matrix polymer and a modifier polymer, wherein the matrix polymer is substantially soluble in the developing agent and the modifier polymer is substantially insoluble in the developer solution. The modifier is a copolymer of an alkene and sulfur dioxide that is energy sensitive. It is advantageous if the modifier polymer is poly(2-methyl-1-pentene sulfone) (PMPS). It is advantageous if the weight average molecular weight of these modifier polymers is about 5,000 to about 500,000 g/mol. If the modifier polymers are synthesized using a halogenated chain transfer agent, at least some of the modifier polymer chains are terminated by a halogen moiety.

The modifier polymer responds to radiation primarily via a self-propagating reaction initiated by radiation to effect the relative ease of removal of the resist material by removing the modifier in the irradiated portions of the resist material. Typically, the modifier polymer depolymerizes when exposed to radiation.

The matrix polymer is either a novolac resin or an acrylic containing polymer. It is advantageous if the matrix polymer is a formaldehyde-cresol novolac resin. Use of additional components that enhance the sensitivity of the resist material to radiation and/or that enhance the phase compatibility of the matrix polymer and the modifier polymer is acceptable. Materials with a plurality of hydroxyl moieties are contemplated as suitable for enhancing the phase compatibility of the matrix polymer with the modifier polymer. A dissolution promoter such as 4-(4-[1,1-Bis(4-hydroxyphenyl)ethyl]-α,α-dimethylbenzyl)phenol (HDP) is an example of a material that enhances the sensitivity of the resist material.

After the patterning exposure, the image of the pattern introduced into the resist material is developed by treating the resist material with the developing agent in an interruptive manner. In interruptive development, the resist material is treated with the developing agent in a plurality of cycles. The development process is interrupted by removing the developing solution from the resist material and drying the resist material, periodically. After a period of time, the developing agent is then used to further develop the image. Each sequence of develop/stop-develop/dry is one cycle. The time that the resist material is allowed to contact the developing solution is selected so that there is substantially no film thickness loss in those portions of the resist material that are less soluble in the developer solution. Although the mount of film thickness loss that is tolerable in these regions will vary depending upon the process, it is advantageous if the film thickness loss is less than about five percent during the overall development.

The article undergoing fabrication is then treated with an altering agent which preferentially alters regions of the article surface that correspond to the removed portions of the resist material, relative to the regions of the article surface that underly the remaining portions of the resist material. Examples of suitable altering agents include wet and dry etchants that are known as useful for the selective removal of material in such processes.

It is advantageous if the resist material-coated substrate is subjected to an elevated temperature that is below the decomposition temperature of each of the components of the resist material prior to being exposed to radiation. For example, if the resist material is a combination of a meta, para cresol novolac resin, PMPS and HDP, that temperature is about 120° C. to about 130° C. It is also advantageous if the resist material is baked after the resist material is exposed to radiation at a temperature that is below the glass transition temperature of the resist material. If the resist material is that of the previous example, that temperature is about 70° C. to about 90° C.

DETAILED DESCRIPTION

Figure 1:
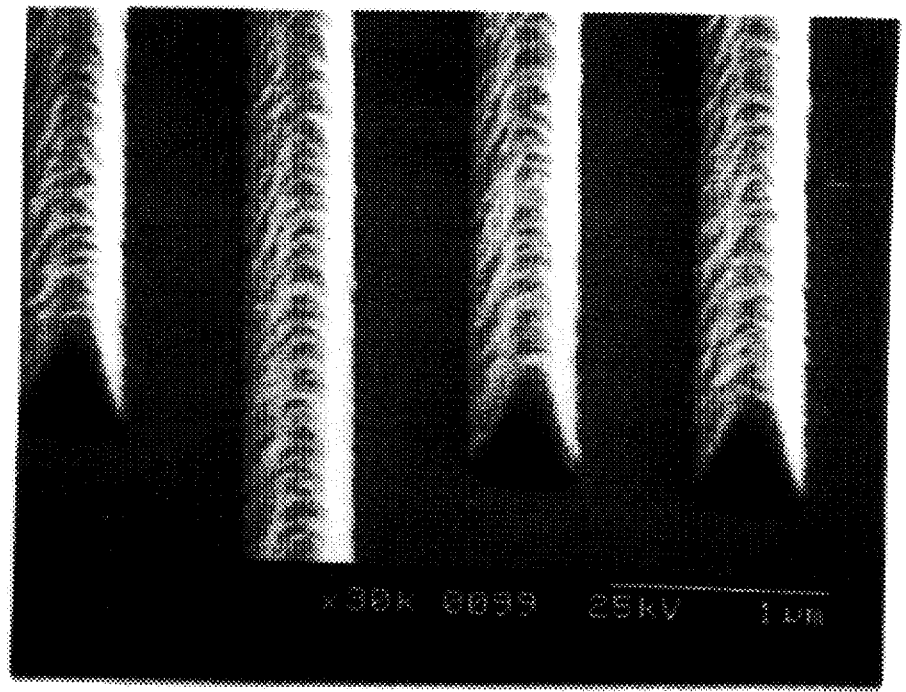
FIG. 1 is an SEM photomicrograph of a patterned resist material which was developed using a single step, continuous development process.

The process of the present invention is directed to a process for device fabrication that uses a resist material made of a matrix polymer and a modifier polymer. A pattern is developed in the resist material. The pattern has excellent wall profiles, which are particularly desirable for fabricating devices with fine features, e.g. 0.5 μm or less. In one embodiment of the present invention, the resist material is a phase compatible blend of a matrix polymer such as a novolac polymer and a modifier polymer that is the copolymer poly(2-methyl-1-pentene sulfone). The modifier inhibits the solubility of the resist material in developing solution. The modifier polymer depolymerizes when the modifier polymer is exposed to radiation. The solubility of the resist material is thereby changed. Thus, the developer solution solubility of the exposed resist material is quite different than the developer solution solubility of the unexposed resist material. When the resist material is patternwise exposed to radiation, the pattern is developed by contacting the resist material with a developer solution. The portion of the resist material that is more soluble in the developer solution (the exposed portion of the resist material is the more soluble if the resist material is positive acting) is dissolved by the developer solution. The portion of the resist material that is less soluble in the developer solution is not significantly dissolved in the developer solution. In general, the resist pattern is amenable to the various agents and ambients to which prior art photoresist novolac patterns are exposed.

The resist is typically positive acting, and is sensitive to radiation of a variety of wavelengths, e.g., deep ultraviolet, electron beam radiation, ion beam, and x-ray radiation. The significant requirements of the modifier are (1) self-propagating chain scission; (2) alteration, (of modifier) generally by removal as a direct or indirect consequence of irradiation; (3) a significantly lower solubility in developer solution than the matrix polymer (4) ability to form a phase compatible blend with a matrix polymer so that the blend, itself, will be less soluble in developer solution than the matrix polymer itself. It is advantageous if the modifier copolymer depolymerizes when exposed to radiation and is vapor developable.

The matrix polymer is chosen so that it does not adversely affect the modifier chemistry when exposed to radiation. For example the matrix polymer is chosen so that it does not cross link at the exposure wavelength. Choice of the matrix polymer is largely in terms of its solubility in developer solution and its phase compatibility with the modifier polymer. It is also advantageous if the matrix polymer provides a resist material with masking properties adequate for intended use. It is contemplated that the resist material will provide adequate masking properties when conventional dry processes are used to transfer the pattern defined by the patterned resist into the underlying substrate.

The invention is concerned with compatible processes and resists for lithographic pattern delineation. It is advantageous if the resist material is compatible with "dry processing"—e.g. processing in which resist patterns serve to shield underlying, adherent surface regions during processing involving charged particles, such as, ions, ion radicals or electrons, or other reactive vapor species, such as free radicals. This is advantageous because (1) substantial throughput is available due to an expedient level of radiation sensitivity compatible with other resist characteristics and (2) the resist has excellent stability to dry processing environments. While the invention is most meaningfully defined in terms of the resist composition-process pair, it is convenient to discuss it in terms of the two separately.

COMPOSITION

A. General

Resist compositions upon which all inventive resist-process couples and related articles are based include two essential ingredients: (a) modifier, and (b) matrix polymer. In each instance as discussed, the resist in its entirety is a phase compatible blend. Prior to lithographic exposure, it is advantageous if the resist composition is homogeneous to the order of the lithographic dimensions or less, typically 500 Angstroms or less. Convenient determinative methods for "phase compatibility" are described in *Polymer Compatibility and Incompatibility*, Vol. II (Karl Solc, ed., Harwood Academic, 1982). The requirement for phase compatibility as so stated is well understood to those skilled in the art. It is also common to all aspects of the invention that the masking properties of the patterned resist are due directly or indirectly to the matrix polymer. In the simplest case—that serving as a preferred embodiment—these properties are largely due to the matrix polymer itself. The function of the modifier is to somehow alter the matrix polymer so that behavior subsequent to exposure will discriminate between exposed and unexposed regions.

Relevant characteristics of the essential resist components are discussed below.

B. Modifier

The modifier is characterized by a many-event response to absorption of actinic radiation. The desirable characteristics of these modifiers are described in U.S. Pat. No. 4,289,845 to Bowden et al., which is hereby incorporated by reference.

Much of the invention is discussed in terms of a positive acting resist. Resist materials for this purpose depend upon a polymeric modifier which depolymerizes—ideally vapor develops, i.e. the modifier volatilizes, during lithographic irradiation. An illustrative material which vapor develops at room temperature is poly(2-methyl-1-pentene sulfone). It is found that inclusion of such a modifier within the weight percentage range of from about 2 to about 30 percent based on the modifier-matrix polymer pair, with a weight average molecular weight of about 5000 to about 500,000 g/mol, if blendable with an appropriate matrix polymer, will result in a resist material with a lithographic sensitivity, based on an incident dosage of 10 kV electrons, of as little as 1μCoulomb/cm$^2$. Lower molecular weight polymers have the advantage of having better phase compatibility with certain matrix polymers than higher molecular weight polymers. It is advantageous if the modifier is about 5 weight percent to about 15 weight percent of the matrix and modifier polymers in the resist material.

It is advantageous if at least some of the modifier polymer chains are terminated by a halogen moiety such as bromine or chlorine. Halogen-terminated polymers are obtained by synthesizing the modifier polymer using a halogen-containing chain transfer agent. Bromotrichloromethane (CBrCl$_3$) is one example of a suitable chain transfer agent. Other suitable chain transfer agents will be readily apparent to those skilled in the art. Although applicants do not wish to be held to a particular theory, it is applicants' belief that use of a halogenated chain transfer agent causes the modifier polymer chains to have a lower intrinsic viscosity than the prior art modifiers described in U.S. Pat. No. 4,289,845 to Bowden et al. The lower intrinsic viscosity indicates a lower molecular weight polymer; and a lower molecular weight modifier polymer is more phase compatible with the matrix polymer.

Polysulfones constitute a promising category of modifiers. In addition to that specified above, other vapor developable polysulfones suitable for use are: poly(cyclohexene sulfone) and poly(2-heptene sulfone). The polysulfones described depolymerize under appropriate actinic irradiation and normal processing conditions. Listed materials vapor develop during exposure at room temperature; others may require additional energy during or subsequent to exposure. Stated more generally, any polymeric material raised above its polymerization ceiling temperature suffices for depolymerization for this embodiment of the invention. The ceiling temperature is that temperature above which the polymer typically will not form. It will be understood by any skilled polymer chemist that an additional implicit requirement is the essential absence of any competing mechanism, such as cross-linking of the matrix polymer, which may offset the desired effect of modifier depolymerization.

C. Matrix Polymer

The matrix polymer is selected on the basis of its solubility in developer solution, its compatibility with the modifier polymer, and its masking properties. The matrix polymer in general constitutes the major component of the resist (70 to 98 wt. %), and accordingly, such properties as film forming, adhesion, stability, etc., are in general determined by this component. It is particularly useful to the worker familiar with current fabrication techniques that resist patterns may be formed of materials in current use. For this reason, novolacs so familiar in replication photoresists are exemplary of preferred embodiments both for positive acting and negative acting resists of the invention.

Novolacs are conveniently defined as condensation polymers of phenols (substituted or unsubstituted) with aldehyde—e.g., phenol formaldehydes. An additional category of resist materials familiar to the present day worker are the acrylic-containing polymers, e.g., the copolymer of styrene and methacrylic acid. Both categories, in current use in photoresists, are suitably incorporated in blends of the invention in which they may serve as matrix polymer.

As elsewhere in this description, parameters such as molecular weight, molecular weight distribution, degree of branching, etc., vary according to the particular composition chosen and are well understood by the artisan. Such parameters in general are significant in defining that class of material having suitable viscosity, film forming properties, stability, sensitivity (where applicable) etc. For the novolacs, it is convenient to operate within a weight average molecular weight range generally of about 2,500 to about 25,000 g/mol. For the acrylic-containing polymers, ease of application and other practical considerations dictate a much higher range—about 10,000 to about 40,000 g/mol. weight average molecular weight or even higher in certain instances.

Such matrix polymers are, combined with modifiers, as e.g., listed in section (A) above. In a positive-acting resist, use of a depolymerizing modifier, e.g., a polysulfone, results in initial insolubilization in, for example, aqueous tetramethyl ammonium hydroxide. Irradiation-promoted depolymerization and volatilization of the modifier returns the matrix polymer essentially to its virgin solubility state where irradiated. Use of a polymerizing modifier results in insolubilization of the blend only where exposed to lithographic radiation, thereby producing a negative acting resist.

D. Other Components

Other compositional variations are concerned with additives for a variety of known purposes. So, for example, cross-section for a specific X-ray wavelength may be increased by appropriate choice of composition of either matrix polymer or, more typically, modifier polymer. In addition, the resist material may contain other appropriate materials such as antioxidants, adhesion-promoting additives, and compositions that enhance the phase compatibility of the matrix polymer and the modifier polymer and/or increase the sensitivity of the resist material. In this regard, it is advantageous if a third component is added to enhance the phase compatibility of the matrix polymer and the modifier polymer. If the matrix polymer is a novolac resin, suitable "compatibilizers" are contemplated as having one or more hydroxyl moieties to enhance the intermixing of the novolac resin, with the modifier polymer. An example of a material that increases the sensitivity of the resist is HDP. The HDP is about 2 weight percent to about 10 weight percent of the resist material.

From this it also follows that, if the hydroxyl moieties are pendant to the modifier itself, the compatibility of the matrix polymer and the modifier polymer will be enhanced without adding a third component "compatibilizer." However, the number of hydroxyl moieties pendant to the modifier must be controlled so that the solubility of the modifier polymer in the developer solution is not significantly affected. Such control must be exercised to maintain a significant difference in developer solubility between the matrix polymer and the modifier polymer.

PROCESSING

This section is set forth in general terms with ranges indicated where suitable. Specific embodiments contemplated are set forth in the examples.

A. Patterning

Contemplated processes include primary pattern delineation, whether in a mask or a maskless process, as well as pattern replication (secondary pattern delineation). This section outlines procedures which may be followed by delineation including: (1) application and other initial preparation; (2) exposure; (3) post exposure treatment; (4) development; and (5) subsequent resist processing.

(1) Application and Other Initial Preparation

The resist solution is prepared by dissolving the resist material in a suitable solvent. The solution is then coated on a substrate using, for example, conventional spin coating techniques. Exemplary solvents are ethyl 3-ethoxypropionate and mixtures thereof. Factors dictating their choice include boiling point (90°–150° C.): lower boiling point increases the need for precautions to avoid loss during deposition; higher boiling point results in inconvenient evaporation rates during coating. Concentration, again, is determined by usual considerations, such as desired film thickness and viscosity requirements for contemplated coating conditions. In general the matrix polymer concentration of from 15 to 25 weight-per-volume percent solution is useful for flood-spin coating.

While application may take many forms, the examples make use of conventional coating by flooding and subsequently spinning. (Choice within the range of from 1,000–10,000 rpm results in an adequate thickness range for the indicated solute-solvent concentration range).

Following spinning, the air dried film may be pre-baked to remove residual solvent. Typically, temperatures of from 40° C. to 150° C. are suitable using either a convection oven, vacuum oven, or a hot plate. The temperature selected is below the decomposition temperature of the components of the resist material.

(2) Exposure

Generally an incident x-ray exposure dose of about 10 to about 100 mJ/cm$^2$ is required. In electron beam lithography an incident dose of approximately 1 to 10μ Coulomb/cm$^2$ at 10 kV is required for the usually contemplated film thickness. Accelerating voltage over the range of from 5–100 kV results in compensating increasing electron density and decreasing absorption cross-section for usual electron sources so that throughput is not significantly affected.

Dosage indicated is in terms of removal of irradiated material in the developer without any thinning of unirradiated material during development. Data in the literature is sometimes based on forced development in which unirradiated material is thinned during development. On this basis, dosage may be reduced from the indicated values.

(3) Post-Exposure Treatment

To improve sensitivity of the resist material, it is advantageous to introduce additional energy to effect or better effect modification of matrix polymer development characteristics. Where the modifier is designed to depolymerize, this step may consist of heating to further volatilize the material from the exposed film regions. Maximum permissible temperature is determined by the desire to avoid undesirable thermally induced reaction. The temperature chosen for the post-exposure heat treatment is based upon the thermal properties of the matrix polymer and the modifier polymer. It is advantageous if the bake temperature is below the glass transition temperature and the decomposition temperature of both polymers in order to maintain the free volume produced by the volatilization of the modifier polymer in the exposed portions of the resist material. If the temperature is above the glass transition temperature and the decomposition temperature of the polymer, the excess free volume in the exposed film will be reduced or removed. If the matrix polymer is a novolac resin and the modifier polymer is PMPS, it is advantageous if the resist material is subjected to post-exposure heat treatment at a temperature of about 40° C. to about 100° C. It is also contemplated that post-exposure baking will take place in a reduced pressure environment, i.e. below atmospheric pressure, as an additional driving force to increase volatilization.

(4) Development

In the process of the present invention, the latent image of the pattern in the resist material is developed in an interruptive manner. In interruptive development, the development process is periodically suspended, and the film is rinsed and dried. Interruptive development is advantageous because, in a positive acting resist, it reduces the film loss of the nonexposed resist material that is not removed by the development process by reducing the amount to which the developer solution can permeate into those portions of the resist material.

Interruptive development is practiced by halting the development process at least once before the regions of resist material that are removed by the developer solution (the exposed regions if the resist material is positive acting) are completely developed. For example, while spraying the resist material with developer solution and simultaneously spinning the substrate on which the resist material is formed, the spray stream is, sequentially: (1) a developer solution; (2) a combination of developer solution and water; and (3) water. The stream is then stopped and the resist material is dried. This constitutes one cycle in an interruptive development process. The cycle is repeated at least once and typically two or more times. Because the cycles are repeated until the desired portions of the resist material are developed out, the length and number of cycles varies depending on the exposure dosage, the concentration of modifier polymer in the matrix polymer, the post-exposure bake conditions to which the resist material is exposed, and the developer composition. The length of a cycle is chosen so that there is substantially no film thickness loss, in a given cycle, in those areas of the resist material that are not removed by the developer solution. Although the amount of film thickness loss that is tolerated depends upon the process, it is advantageous if the film thickness loss is less than about two percent per cycle. For example, if the resist material is made of a formaldehyde-cresol novolac matrix polymer and a PMPS modifier, an advantageous interruptive development cycle is: (1) spray with a developer solution for 30 seconds; (2) overlap spray with developer solution and deionized water for five seconds; (3) spray with deionized water for 30 seconds; and (4) dry with a nitrogen spray for 90 seconds. A total of five to six cycles are performed.

(5) Subsequent Resist Processing

Post-development baking is generally desirable to free the now developed resist of developing solvent. Under certain circumstances, as in plasma etching, where some heating implicitly results, a separate post-development baking step may not be necessary. For resist layer thicknesses of up to about one micron, solvent is substantially removed by baking for a period of up to about thirty minutes at temperatures of about 100° C. to about 120° C. Substantially shorter time periods are required if hot plate baking is used. Atmosphere is not generally critical.

B. Pattern Transfer

The resists are used in processes for fabricating masks and processes for fabricating devices. These processes are described generally in U.S. Pat. No. 4,289,845 which is hereby incorporated by reference.

The process is advantageous in the fabrication of fine features, e.g. a features size of less than 0.5 μm, by dry processing. Dry processing contemplates modification of bared regions of substrate by a vapor agent. For these purposes, dry processing contemplates all nonliquid/ nonsolid media whether uncharged or charged; whether of balanced or unbalanced charge. At this time, a variety of dry processing steps are in use. Descriptive terms sometimes overlapping but all contemplated where the term dry processing is used include: ion etching, ion beam milling, reactive ion etching, plasma etching, reactive sputter etching, sputter etching, and gas phase chemical etching.

Dry processes may also be designed to modify underlying substrates through material introduction or other mechanism, as well as removal. Such dry processing may involve true material addition as an implantation, vacuum deposition, sputter deposition, as well as deposition through reduction or oxidation reactions; or other change, such as, local strain enhancement, e.g., as resulting from lattice distortion due to high energy bombardment. The enumeration is not intended to be exhaustive.

While an advantage of the inventive resists is their comparative stability to dry processing media, they have been found suitable for wet processing procedures, as well. It is possible that their use in wet processing may be a matter of convenience. In general, in commercial processing economy in use of apparatus as well as in inventory control is realized by minimizing the number of agents used. Wet etching contemplated, therefore, includes the whole spectrum of procedures in use or to be used. A listing of contemplated wet processes includes: liquid etching, and electrode, electroless, or displacement plating.

EXAMPLE 1

A resist material according to the present invention was prepared by combining a modifier with a formaldehyde-cresol novolac matrix polymer that was synthesized from a monomer charge mixture with a meta cresol-to-pare cresol mole ratio of 75:25, by Borden, Inc., of Louisville, Ky. The weight average molecular weight of the novolac polymer was about 3500 g/mole.

The modifier, a copolymer of 2-methyl-1-pentene and sulfur dioxide (PMPS) was synthesized by evacuating a reactor and backfilling with argon (16 psia) to remove most of the residual oxygen therefrom. A chain transfer agent (bromotrichloromethane; 16 mL) and degassed toluene (190.9 g) was added to the reactor. The mixture was then cooled to −20° C. The reactor was then evacuated. Sulfur dioxide (183.9 g) was added to the reactor. The reactor was then repressurized with argon to a pressure of 16 psia. 2-methyl-1-pentene (42.2 g) was then added to the reactor.

An initiator solution composed of t-butyl hydroperoxide (2.15 mL; 3M solution in 2,2,4-trimethylpentane) and toluene (48 mL) was prepared. After the reaction mixture was further chilled to −48° C., a portion of the initiator solution (25 mL) followed by toluene (10 mL) was added to it. The reaction mixture was stirred and maintained at a temperature of −48° C. for six hours after addition of the initiator solution. The reaction mixture was then warmed to room temperature while venting the excess $SO_2$ from the solution.

The polymer was then precipitated by transferring the reaction mixture, together with an acetone rinse (75 mL) of the reactor, into hexane (1500 mL). The resulting mixture was then stirred and allowed to stand for one hour. The hexane was decanted from the mixture, and the remaining solids were rinsed with additional hexane.

The polymer was then purified by dissolving the precipitate in acetone, bringing the total volume of the solution to 50 mL. This acetone/polymer solution was then dripped into a mixture of methanol and water (600 mL of a 2:1, by volume, solution) while it was being stirred. The slurry that resulted was allowed to settle, after which it was filtered. The solids were washed a total of three times with the methanol:water mixture.

The obtained solids were then dried under vacuum at ambient temperature. The material was subjected to elemental analysis, performed by combustion analysis, which revealed the polymer composition to be: carbon (48.14%); hydrogen (8.04%); sulfur (20.78%); bromine (0.65%); and chlorine (0.88%), which indicates that bromine and chlorine were incorporated into the polymer. The intrinsic viscosity of the resulting polymer was determined to be 0.053 dL/g as measured in 2-butanone at 30° C. The estimated weight average molecular weight of the polymer was estimated to be less than 20,000 g/mole.

The resist material was prepared by combining the novolac (24 g) and the PMPS (2.4 g) with a spinning solvent, ethyl 3-ethoxypropionate (100 mL). The solution was filtered through a 0.2 micron teflon filter, and the solution was then spin coated at a spin speed of 3300 rpm onto suitable silicon substrates previously primed with hexamethyldisilazane (HMDS). The resulting films were subjected to a post-application bake (also known as a pre-exposure bake or prebake) of either 120° C. or 130° C. for 1 hour in a convection oven. The prebake temperature was varied to determine the effect of prebake temperature on film loss after development. The resulting films had a thickness of about 6500 to about 7000 angstroms.

EXAMPLE 2

The resist material was prepared and formed onto substrates as described in Example 1 except that a third component, HDP (0.96 g) was added to the resist material. The resist material was then formed onto substrates as described in Example 1.

EXAMPLE 3

The resist material was prepared and formed onto substrates as described in Example 1. The resist material was patternwise exposed to e-beam radiation. A Cambridge EMBF model 10.5 exposure tool operating at 40 kV was used for this purpose. A one nA spot current with a beam address of 0.02 to 0.05 μm was used. Doses were varied from 5 to 50 $\mu C/cm^2$.

EXAMPLE 4

The coated substrates of Examples 1 and 2 were placed in a pulsed laser point source proximity x-ray exposure stepper and exposed to x-ray wavelength radiation (0.8–2.2 nm centered at 1.4 nm) through a suitable mask. The substrates were exposed to radiation in a helium atmosphere, with a delivered energy of 0.3 $mJ/cm^2$/pulse to 0.7 $mJ/cm^2$/pulse at a pulse rate of 1 Hz. The dosage was varied in the range of about 10 $mJ/cm^2$ to about 75 $mJ/cm^2$. To evaluate the effect of a post-exposure baking step on film thickness loss, some of the exposed substrates were post-exposure baked under a vacuum of about $6\times10^{-4}$ Torr, at a temperature of 70° C. to 90° C. for about one-half hour.

The latent images so introduced into the resist material were developed using an APT Model 914 spray development system obtained from CONVAC/Applied Process Technology. The developer solution was aqueous tetramethylammonium hydroxide (0.17N to 0.26N) and deionized water was used as the rinse. Some of the substrates were continuously developed for about 120 to 220 seconds by being spun while sprayed with developer solution, and then rinsed. The development time was selected based upon the amount of time it took for the exposed regions of the film to clear. The resist material of Example 1 took 220 seconds to clear. The pattern (0.5 micron lines and spaces) obtained in the resist material developed using this technique is shown in FIG. 1.

Figure 2:
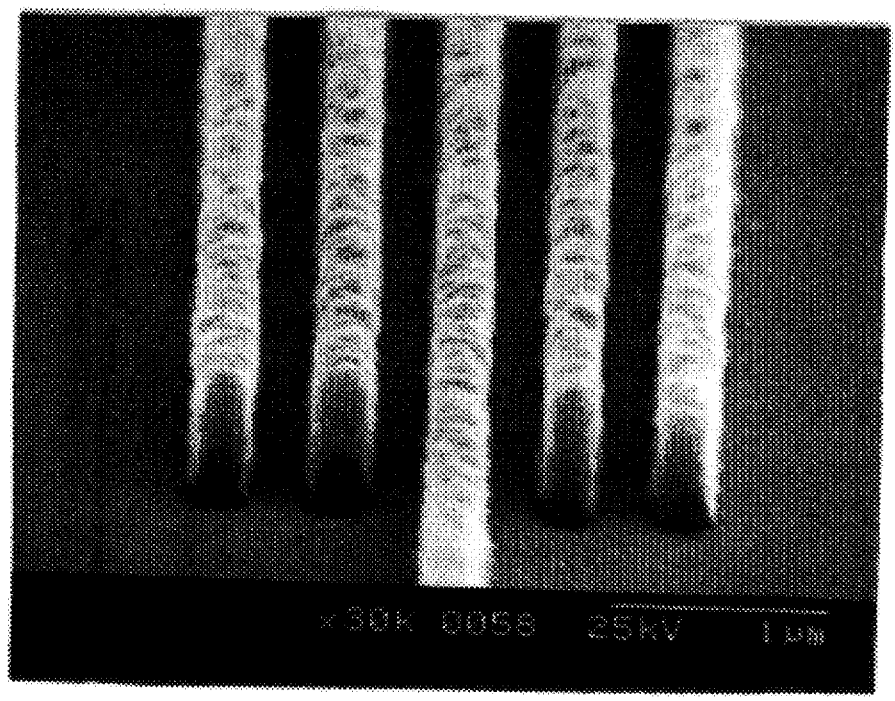
FIG. 2 is an SEM photomicrograph of a patterned resist material which was developed using an interruptive development process.

Other substrates were developed using an interruptive development process. With the substrate spinning in the development chamber, the resist-coated substrate was sprayed with the developer solution for about 30 seconds; overlappingly sprayed with developer solution and rinse water for 5 seconds; sprayed with rinse water for 30 seconds; and dried with nitrogen for 90 seconds. The cycle time was chosen so that substantially no film thickness loss in the non-exposed regions of the resist material was observed during the development of the exposed regions of the resist material. The sequence was repeated for a total of five cycles. Using this process sequence, lines and spaces (0.25 micron) were delineated and are illustrated in FIG. 2. Using this process sequence, equivalent 0.25 micron lines and spaces were delineated in the resist material of Example 1 at a dose of 61 $mJ/cm^2$ and in the resist material of Example 2 at a dose of 37 $mJ/cm^2$. This demonstrates that the HDP added to the resist material in Example 2 increased the sensitivity of the resist material. Furthermore, by comparing the wall profiles in FIG. 1 (obtained without interruptive development) with the wall profiles in FIG. 2 (obtained by interruptive development), it is apparent that the wall profiles obtained by interruptive development are far superior.

EXAMPLE 5

The effects of prebake temperature, post-exposure bake, and interruptive development on the properties of the resist materials coated onto wafers and exposed as described in Example 4 were analyzed. As demonstrated by Table I below, the percent film loss in the unexposed portion of the film, based on an initial film thickness of about 0.65 to about 0.7 microns, was less when the prebake temperature was increased from 120° C. to 130° C. The use of a post-exposure bake step also reduced the observed amount of film loss. However, the film loss was dramatically reduced when the interruptive development technique was used instead of the continuous development technique.

TABLE I

| Prebake Temp. °C. | Post-Exposure Bake Temp. °C. | Development process | Film loss % |
|---|---|---|---|
| 120 | none | Continuous; 150 sec | 54.2 |
| 130 | none | Continuous; 180 sec | 36.5 |
| 130 | 70 | Continuous; 180 sec | 29 |
| 120 | 70 | Interruptive; 5 × 30 sec | 4.2 |
| 130 | 70 | Interruptive; 6 × 30 sec | 1.8 |

The above examples are intended to illustrate the claimed invention. One skilled in the art will recognize that other materials and conditions can be substituted for those enumerated in the examples that are within the scope of the appended claims.

We claim:

1. A process for device fabrication comprising:

(1) selectively exposing portions of an energy-sensitive resist material overlying a substrate to patterning radiation whereby a difference in ease of removal of exposed portions of the resist material relative to unexposed portions of the resist material by an aqueous base developing agent is effected, wherein the resist material is a phase compatible blend of a matrix polymer and a modifier polymer, wherein the matrix polymer is substantially more soluble in the aqueous base developing agent than the modifier polymer, and the modifier is a vapor-developable copolymer of an alkene and sulfur dioxide that is energy sensitive, wherein the average molecular weight of the modifier polymer is about 5,000 g/mol to about 500,000 g/mol, and wherein the modifier polymer responds to radiation primarily via a self-propagating reaction initiated by radiation to effect ease of removal by removing modifier in the irradiated portions of the resist material;

(2) developing the pattern in an interruptive manner wherein the resist material is treated with an aqueous base developing agent and the development is stopped in a plurality of cycles, the time for the first cycle being insufficient to clear the resist material that is removed by the aqueous base developing agent; and (3) treating the article undergoing fabrication with an altering agent which preferentially alters regions of the article corresponding with the removed portion of the resist material, relative to the regions of the article surface underlying the remaining portions of the resist material.

2. The process of claim 1 wherein at least a portion of the modifier polymer is chain-terminated by a halogen moiety selected from the group consisting of bromine and chlorine.

3. The process of claim 2 wherein the matrix polymer is a novolac resin polymer.

4. The process of claim 3 wherein the modifier polymer is poly(2-methyl-1-pentenesulfone).

5. The process of claim 4 further comprising heating the resist material to about 120° C. to about 130° C. prior to exposing the resist material at a temperature of radiation.

6. The process of claim 5 further comprising baking the resist material at a temperature of about 70° C. to about 90° C. after the resist material is exposed to radiation.

7. The process of claim 4 wherein the radiation to which the resist material is selectively exposed has a wavelength of about 0.8 nm to about 2.2 nm.

8. The process of claim 4 wherein the radiation to which the resist material is exposed is e-beam radiation.

9. The process of claim 3 wherein the resist material further comprises a third component that enhances the phase compatibility of the matrix polymer and the modifier polymer, the third component having a plurality of hydroxyl moieties.

10. The process of claim 3 wherein the resist material further comprises a dissolution promoter that enhances the sensitivity of the energy-sensitive resist material which is 4-(4-[1,1-Bis(4-hydroxyphenyl)ethyl]-α,αdimethylbenzyl) phenol.

* * * * *